United States Patent [19]
Murata et al.

[11] Patent Number: 5,261,013
[45] Date of Patent: Nov. 9, 1993

[54] PHOTOELECTRIC CONVERTER AND IMAGE READING APPARATUS MOUNTING THE SAME

[75] Inventors: Masayoshi Murata, Atsugi; Katsumi Komiyama, Isehara; Tatsundo Kawai, Hiratsuka; Makoto Ogura, Isehara; Hiroo Ichihashi, Chigasaki; Osamu Hamamoto, Hiratsuka, all of Japan

[73] Assignee: Canon Kabushiki Kaisha, Tokyo, Japan

[21] Appl. No.: 845,052

[22] Filed: Mar. 3, 1992

Related U.S. Application Data

[62] Division of Ser. No. 481,227, Feb. 20, 1990, Pat. No. 5,121,225.

[30] Foreign Application Priority Data

| Feb. 21, 1989 | [JP] | Japan | 1-39364 |
| Feb. 21, 1989 | [JP] | Japan | 1-39365 |
| Feb. 28, 1989 | [JP] | Japan | 1-47409 |
| Feb. 28, 1989 | [JP] | Japan | 1-47410 |
| Feb. 28, 1989 | [JP] | Japan | 1-47411 |

[51] Int. Cl.$^5$ ............ G06K 9/00; H04N 1/024; H01L 31/02
[52] U.S. Cl. .................. 382/65; 358/471; 358/482; 358/496; 357/431
[58] Field of Search .......... 382/65; 358/471, 482, 358/496; 357/30

[56] References Cited

U.S. PATENT DOCUMENTS

| 4,689,652 | 8/1987 | Shimada et al. | 358/471 |
| 4,908,718 | 3/1990 | Shimada | 358/482 |
| 4,920,431 | 4/1990 | Ogura et al. | 358/496 |

Primary Examiner—Leo H. Boudreau
Attorney, Agent, or Firm—Fitzpatrick, Cella, Harper & Scinto

[57] ABSTRACT

A photoelectric converter includes a transparent substrate having a photoelectric converting element provided on a surface opposing a document relating to reading of image information, a transparent support for supporting the substrate, and a light source provided on a surface of the support opposite to a supporting surface for the substrate. Light emitted from the light source is radiated on a document through the support and the substrate, and reflected light is received by the photoelectric converting element.

11 Claims, 14 Drawing Sheets

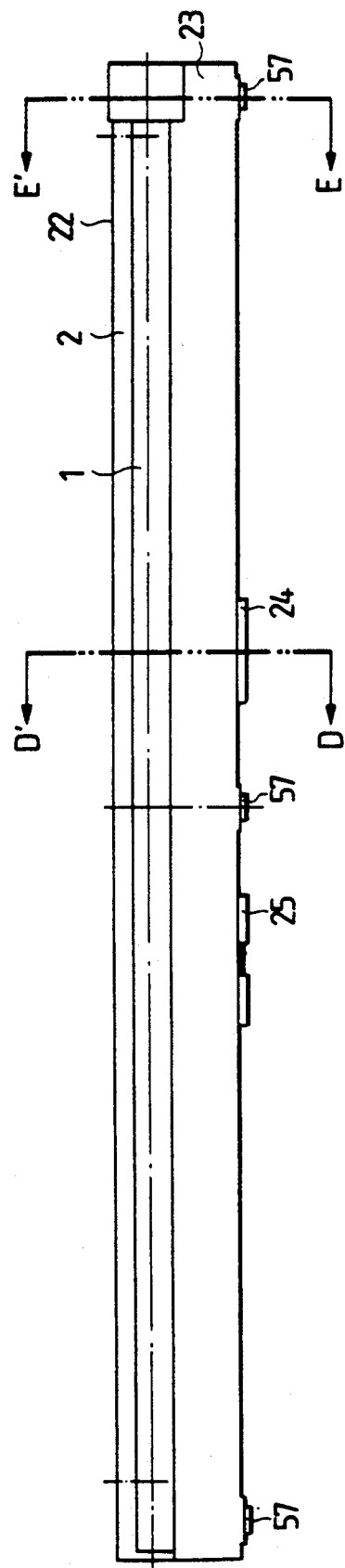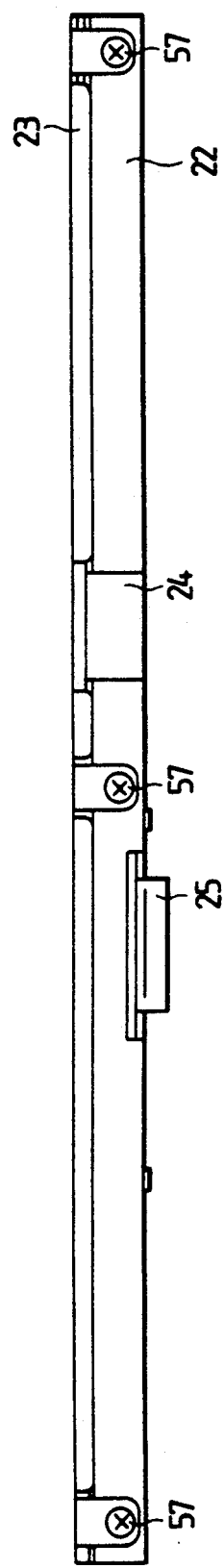

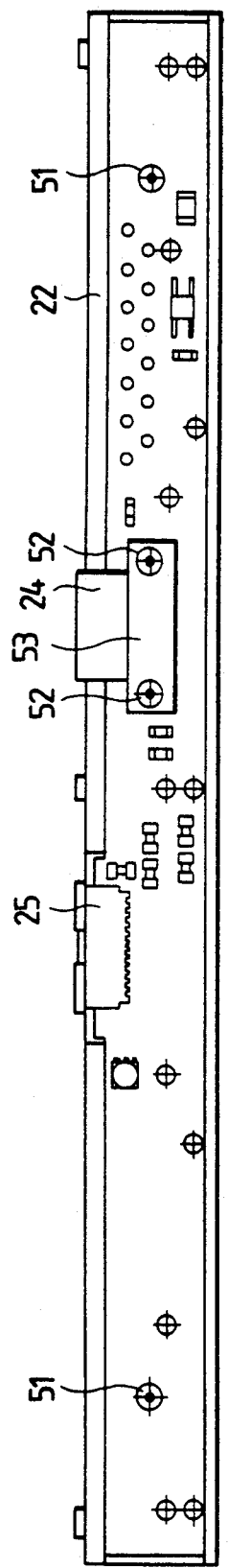
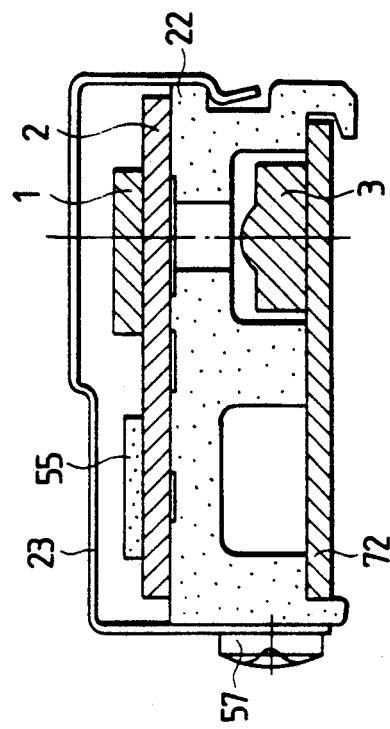
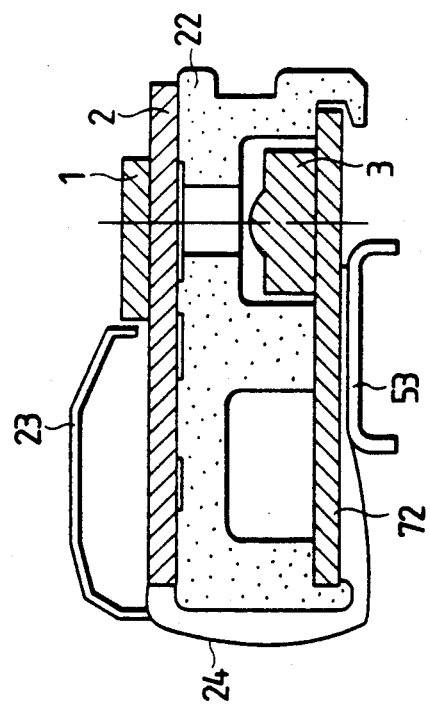
FIG. 6C
FIG. 6E
FIG. 6D

PHOTOELECTRIC CONVERTER AND IMAGE READING APPARATUS MOUNTING THE SAME

This application is a division of application Ser. No. 07/481,226 filed Feb. 20, 1990, now U.S. Pat. No. 5,121,225.

BACKGROUND OF THE INVENTION:

1. Field of the Invention

The present invention relates to an image reading apparatus such as a facsimile, a copying machine, and an electronic black board, a photoelectric converter to be mounted in the apparatus, and an image reading apparatus mounting the photoelectric converter and, more particularly, to a photoelectric converter in which a photoelectric converting element (photosensor) array is formed.

2. Related Background Art

In order to reduce the size of a photoelectric converter and improve the yield to reduce a manufacturing cost and the like, photoelectric converters as shown in FIGS. 1A and 1B are proposed. These converters adopt an arrangement in which a sensor substrate having a photosensor is mounted on a support (to be referred to as a packaging substrate) formed in another step.

These converters will be described in detail below.

FIGS. 1A and 1B are a schematic perspective view and a sectional view, respectively, showing conventional photoelectric converters. Referring to FIG. 1A, a ceramic substrate 1001 has a driver portion 1002, a sensor portion 1003, and a bonding gold wire 1004. Such a photoelectric converter is disclosed in, e.g., Japanese Patent Laid-Open No. 60-132452.

In the arrangement shown in FIG. 1A, however, a thick film circuit 1005 as the driver portion 1002 is formed on the insulating ceramic substrate 1001 as a packaging substrate, the photosensor array portion 1003 is fixed on the packaging substrate 1001, and the thick film circuit 1005 and the photosensor portion 1003 are connected by the gold wire 1004 by a wire bonding method. Therefore, since the packaging substrate 1001 is nontransparent, the arranging position of a light source is limited to make it difficult to achieve a sufficiently small optical system which is an advantage of an elongated sensor.

In the photoelectric converter shown in FIG. 1B, a transparent sensor substrate 1032 having a photosensor 1031 is fixed on a transparent packaging substrate 1010 by an adhesive 1070, and a mold 1080 consisting of a nontransparent resin is formed on the photosensor 1031. Information light is received by the photosensor via the transparent packaging substrate and the transparent sensor substrate. A light-shielding plate 1060 for preventing incidence of unnecessary light beams is formed on the transparent packaging substrate. A photoelectric converter having such an arrangement is disclosed in, e.g., Japanese Patent Laid-Open No. 62-97370. In this arrangement, however, information light from a document surface is incident on the light-receiving element (photosensor) through the transparent packaging substrate and the transparent sensor substrate. Therefore, an optical path of the information light to the photosensor is elongated to tend to produce a light quantity loss. In addition, a stray light component is produced due to diffusion light in each layer to tend to reduce an S/N ratio or a sensor output.

In addition to the above problems, if a light source of a photoelectric converter has a light quantity variation, a variation occurs in an output signal from a sensor, or a white or black stripe sometimes appears to cause a read error. As a technique for eliminating this drawback, an arrangement in which a light-adjusting member (lighting curtain) is provided in an optical path between a light source and a document is available. This lighting curtain is in the form of a light-shielding film formed on a film by a pattern capable of obtaining a constant light quantity distribution. Illumination light on the document surface is corrected to be uniformly distributed by the lighting curtain. This arrangement is disclosed in, e.g., Japanese Patent Laid-Open No. 63-310262.

In this conventional technique, however, since the lighting curtain is provided as an additional member, positioning precision between the lighting curtain and the light source may not be held at a high level, and the manufacturing cost is increased.

It should be noted that in a photoelectric converter, as the number of photoelectric converting elements to be arranged is increased to elongate the converter, a wiring pattern is elongated to cause mixing of electrical noise components. Generation sources of the electrical noise are a power source, static electricity generated upon document conveyance (paper passing), a light source circuit, and the like. This electrical noise induces noise in a signal output circuit and makes an image signal unstable. As a means for preventing this problem, a base plate (a box member for fixing a sensor) is held at a constant potential to provide a shielding effect of electrical noise. This shielding effect prevents the electrical noise from entering into a sensor, thereby obtaining a stable image. This arrangement is disclosed in, e.g., Japanese Patent Laid-Open No. 63-310261.

This arrangement, however, has the following problems:

static electricity generated upon paper passing when the base plate is set at a ground (GND) potential enters via the base plate, a GND line, and a driver to destroy the circuit or cause an erroneous operation;

the shielding effect can be provided to the base plate if the plate is made of a conductor such as Al, but it cannot be provided if the plate is made of an insulator such as a resin; and the like.

Japanese Patent Laid-Open No. 62-97370 discloses a method of coating a transparent adhesive on the entire surface between a transparent packaging substrate and a transparent sensor substrate. In this method, however, bubbles may be formed in the adhesive layer to cause a light quantity loss and generate a stray light component.

In addition, since a transparent adhesive which does not cause much light quantity loss, i.e, has high transparency must be selected, a degree of freedom of selection for the adhesive is decreased.

Furthermore, reduction in stress between the transparent packaging substrate and the transparent sensor substrate must be taken into consideration.

SUMMARY OF THE INVENTION:

It is, therefore, an object of the present invention to solve the above conventional problem and to provide a photoelectric converter comprising a transparent substrate having a photoelectric converting element provided on a surface opposing a document to be subjected to reading of image information, a transparent support for supporting the substrate, and a light source provided on a surface of the support opposite to a supporting surface for the substrate, wherein light emitted from the light source is radiated on a document through the support and the substrate, and reflected light is received by the photoelectric converting element.

It is another object of the present invention to provide a photoelectric converter in which since illumination light is transmitted through a transparent packaging substrate (support), a degree of freedom of a location of a light source is improved to reduce the size of the converter, and since information light (light reflected by a document surface) is not transmitted through the transparent packaging substrate and a substrate (transparent sensor substrate), no light quantity loss or diffusion of the information light occurs to improve an S/N ratio and a sensor output.

It is still another object of the present invention to provide a photoelectric converter in which since illumination light is transmitted through a substrate and a packaging substrate, the illumination light is uniformly radiated on a document due to an adequate light quantity loss and diffusion caused upon transmission of the illumination light without adversely affecting each sensor.

It is still another object of the present invention to provide a photoelectric converter comprising a transparent substrate having a photoelectric converting element provided on a surface opposing a document to be subjected to reading of image information, a transparent support for supporting the substrate, a light source provided on a surface of the support opposite to a supporting surface for the substrate, and a light-shielding portion arranged between the support and the substrate and provided in a portion except for an optical path portion for light emitted from the light source, wherein light emitted from the light source is radiated on a document through the optical path portion and the substrate, and reflected light is received by the photoelectric converting element.

It is still another object of the present invention to provide a photoelectric converter in which a light-shielding layer shields, of illumination light emitted from a light source, stray light which causes noise in an output signal, e.g., irregular reflection components from a transparent packaging substrate, thereby improving the resolution of the output signal.

It is still another object of the present invention to provide a photoelectric converter comprising a transparent substrate having a photoelectric converting element provided on a surface opposing a document to be subjected to reading of image information, a transparent support for supporting the substrate, the support having, on its supporting surface for the substrate, a wiring member for connecting the photoelectric converting element to a circuit for driving the photoelectric converting element and a light-adjusting portion formed to have at least a portion consisting of the same material as that of the wiring member, and a light source provided on a surface of the support opposite to the supporting surface for the substrate, wherein light emitted from the light source is radiated on a document through the support, the light-adjusting portion and the substrate, and reflected light is received by the photoelectric converting element.

It is still another object of the present invention to provide a photoelectric converter in which since a light-adjusting portion which is conventionally an additional member is formed to have at least a portion consisting of the same material as a wiring member, and the light-adjusting portion and the wiring member can be formed on a packaging substrate in the same manufacturing step to reduce the size and the manufacturing cost of the converter.

It is still another object of the present invention to provide a photoelectric converter comprising a transparent substrate having a photoelectric converting element provided on a surface opposing a document to be subjected to reading of image information, a transparent support for supporting the substrate, a light source provided on a surface of the support opposite to a supporting surface for the substrate, and a light-shielding portion arranged between the support and the substrate and provided in a portion except for an optical path portion of light emitted from the light source, the light-shielding portion being formed by using a conductive material and held at a constant potential, wherein light emitted from the light source is radiated on a document through the support, the optical path portion and the substrate, and reflected light is received by the photoelectric converting element.

It is still another object of the present invention to provide a photoelectric converter in which a light-shielding layer shields, of illumination light emitted from a light source, stray light which causes noise in an output signal, e.g., irregular reflection components from a transparent packaging substrate, thereby improving the resolution of the output signal, and the shielding layer can also function as an electric shielding layer.

It is still another object of the present invention to provide a photoelectric converter comprising a transparent substrate having a photoelectric converting element provided on a surface opposing a document to be subjected to reading of image information, a transparent support for supporting the substrate, a light source provided on a surface of the support opposite to a supporting surface for the substrate, and a gap portion arranged between the support and the substrate and provided in an optical path portion for light emitted from the light source, wherein light emitted from the light source is radiated on a document through the support, the gap portion and the substrate, and reflected light is received by the photoelectric converting element.

It is still another object of the present invention to provide a photoelectric converter in which since a gap portion (air layer) is formed in an optical path portion between a transparent packaging substrate and a sensor substrate, a step of removing bubbles from an adhesive upon adhesion of the two substrates is omitted, and a range of selection for the adhesive is widened.

BRIEF DESCRIPTION OF THE DRAWINGS

FIGS. 6A, 6B, 6C, 6D and 6E are a schematic plan schematic sectional view taken along a line D—D', and a schematic sectional view taken along a line E—E', respectively, showing the photoelectric converter shown in FIG. 5;

DETAILED DESCRIPTION OF THE PREFERRED EMBODIMENTS

The present invention will be described in detail below with reference to the accompanying drawings.

A preferred embodiment of the present invention is a photoelectric converter comprising:
photoelectric converting means including
a substrate having a transparent portion,
a photoelectric converting element provided on a surface of the substrate opposing a document having image information; and
a light source provided on a surface of the substrate opposite to the opposing surface, radiated on the document through the substrate, and light reflected by the document is received by the photoelectric converting element,
wherein the substrate has a stacking structure constituted by a sensor substrate as a first substrate on which the photoelectric converting element is arranged and a mother board as a second substrate larger than the first substrate.

It is preferred that a semiconductor IC device for driving the photoelectric converting element, a wiring portion for electrically connecting the element to the device, a light-shielding member, a light-adjusting member, a static electricity shielding conductor, and the like are arranged singly or in a combination of two or more thereof on the second substrate.

In addition, the converter is preferably arranged such that a gap is formed between the first and second substrates by an adhesive and illumination light is

1st Embodiment

Figure 1A:
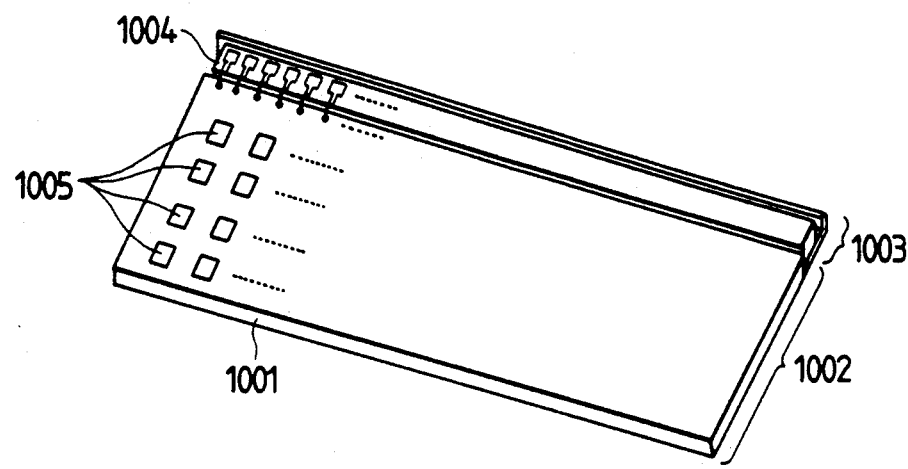
FIGS. 1A and 1B are a schematic perspective view and a schematic sectional view, respectively, showing conventional photoelectric converters.
Figure 1B:
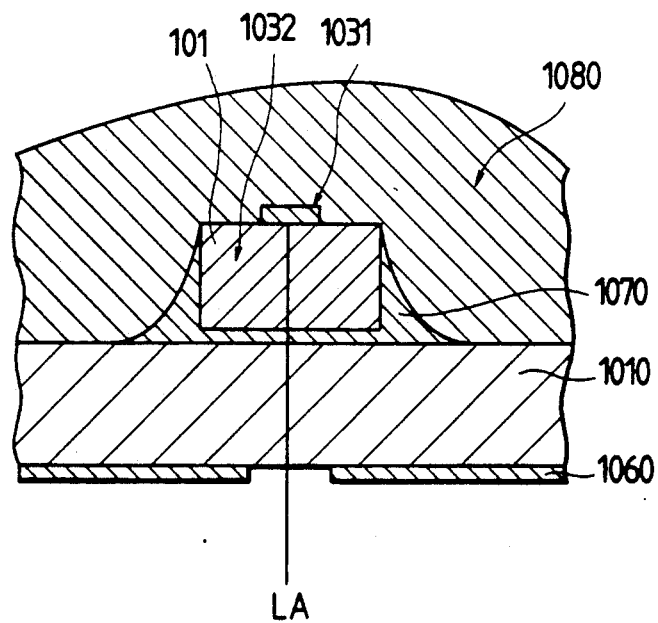
Figure 2A:
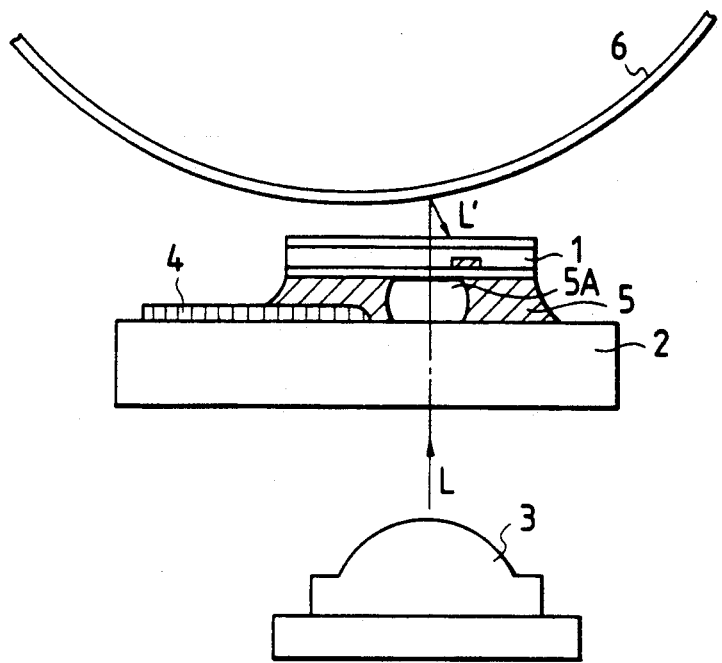
FIGS. 2A and 2B are a schematic sectional view showing a photoelectric converter according to the first embodiment of the present invention and a schematic perspective view showing its part in an enlarged scale, respectively.
Figure 2B:
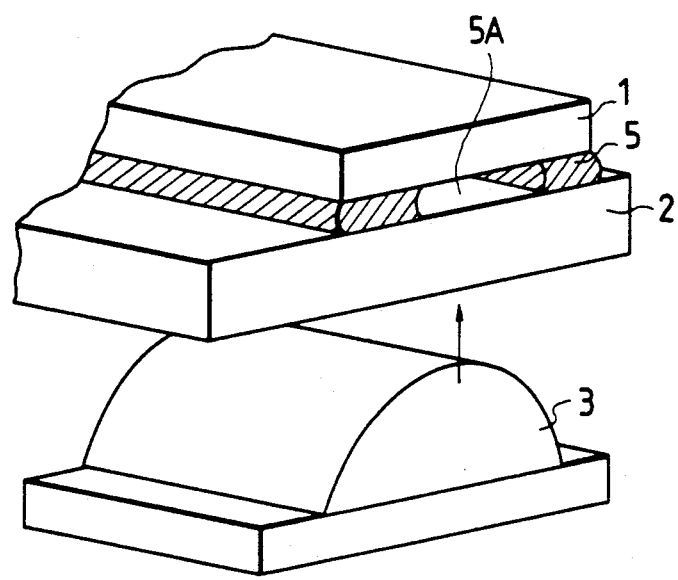

FIGS. 2A and 2B are a schematic side view of a photoelectric converter according to the first embodiment of the present invention and a schematic perspective view showing its part in an enlarged scale. Referring to FIGS. 2A and 2B, a transparent sensor substrate 1 has a photosensor array formed by a semiconductor thin film process or the like on a base consisting of, e.g., quartz glass or borosilicate glass having transparency and an insulating property. A transparent packaging substrate (mother board) 2 has a wiring portion 4 consisting of, e.g., Ag, Ag-Pd, Ag-Pt or Au formed by a thick film printing method or consisting of, e.g., Al, Cu, Mo or ITO formed by vapor deposition, sputtering, a CVD method, photolithography, a thin film formation process or the like on a base consisting of, e.g., quartz glass, borosilicate glass, soda glass or acryl (may have a protective film consisting of, e.g., $SiO_2$ for preventing elution or diffusion of an alkali element) having transparency and an insulating property. Materials having close thermal expansion coefficients are used for the bases of these substrates.

The wiring portion 4 includes wiring for electrically connecting a sensor portion on the substrate 1 to a driver portion (not shown) on the substrate 2. The transparent sensor substrate 1 is adhered on the transparent packaging substrate 2 by an adhesive layer 5.

The adhesive layer 5 for adhering the transparent sensor substrate 1 and the transparent packaging substrate 2 can be formed by a screen printing method, line coating using a dispenser or the like. Examples of the adhesive are a silicone rubber-based room temperature curing adhesive and a photo-setting acryl-based adhesive. The adhesive consists of a material having a thermal expansion coefficient close to those of the materials of the bases of the transparent sensor substrate 1 and the transparent packaging substrate 2 and is applied on a portion corresponding to the peripheral portion of the sensor substrate 1, e.g., at least both side portions in the longitudinal direction of the photoelectric converter and its both end portions, thereby adhering the substrates 1 and 2. In this manner, a gap (air layer) 5A is formed in an optical path portion for illumination light from a light source 3.

The transparent sensor substrate 1 and the wiring portion 4 of the transparent packaging substrate 2 are electrically connected by wire bonding, soldering or the like.

Illumination light L from the light source 3 such as an LED is radiated on a document 6 through the transparent packaging substrate 2, the air layer 5A and the transparent sensor substrate 1, and information light reflected by the document 6 is incident on a light-receiving element on the transparent sensor substrate 1 and output as an image signal from the light-receiving element.

According to this embodiment, since the information light is received by the photosensor without being transmitted through the packaging substrate 2 and the sensor substrate 1, a S/N ratio is not reduced by a light quantity loss or stray light components. According to this embodiment, the transparent sensor substrate 1 formed by, e.g., the thin film semiconductor process and the transparent packaging substrate 2 formed by, e.g., the thick film process can be handled as independent parts, i.e., can be manufactured in independent steps. Therefore, manufacturing steps need not be organized and only good products can be used in independent examination steps, thereby improving the total yield. Since only the photosensor portion is arranged on the base material of the substrate 1, a plurality of substrates 1 can be simultaneously manufactured from a substrate material having a certain area, thereby reducing the manufacturing cost. In addition to the wiring portion 4, a driving IC chip, an output amplifying IC chip and the like can be mounted on the transparent packaging substrate 2. In this case, the advantage of manufacturing the substrates 1 and 2 in independent processes is increased to further reduce the manufacturing cost. Furthermore, the unit size can be further reduced by arranging the light source at the lower surface side of the transparent packaging substrate 2.

That is, according to the first embodiment, illumination light is transmitted through the packaging substrate having transparency. Therefore, a degree of freedom with respect to the location of the light source is improved, i.e., the light source can be located at the lower surface side of the transparent packaging substrate. As a result, an apparatus using this photoelectric converter can be made more compact.

Information light is not transmitted through the transparent packaging substrate and the transparent sensor substrate. Therefore, since neither a light quantity loss nor diffusion of the information light occur, an S/N ratio is improved to achieve a high sensor output.

In this embodiment, the material having close thermal expansion coefficients are used for the bases of the transparent packaging substrate and the transparent sensor substrate. Therefore, since stress produced upon bonding of the two substrates can be relaxed, the substrates do not easily warp or crack.

Since the wiring portion is formed on the transparent packaging substrate, the converter can be made compact. If, for example, the wiring portion is formed between the transparent packaging substrate and the transparent sensor substrate, the converter can be made more compact.

In this embodiment, the air layer 5A is formed in the optical path portion for illumination light between the transparent packaging substrate 2 and the transparent sensor substrate 1. Therefore, a step of removing bubbles in the adhesive layer 5 need not be performed to simplify the manufacturing process, thereby reducing the manufacturing cost.

In addition, since a color adhesive, for example, can be used regardless of its transparency/nontransparency, a degree of freedom of selection for the adhesive is improved.

Furthermore, since the adhesive is partly coated and cured, stress can be relaxed by elasticity of the adhesive even if thermal expansion coefficients of the transparent packaging substrate 2 and the transparent sensor substrate 1 differ from each other.

2nd Embodiment

Figure 3A:
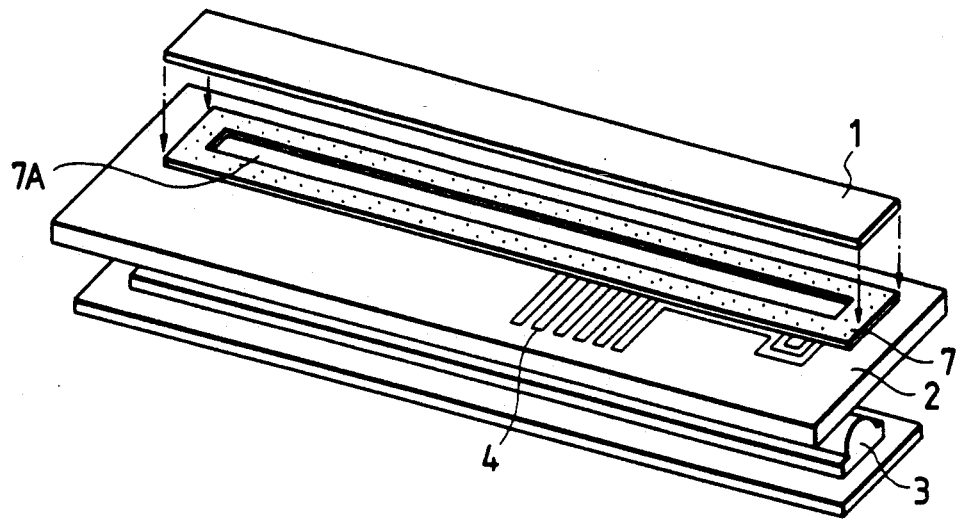
FIGS. 3A and 3B are a schematic exploded view showing a photoelectric converter according to the second embodiment of the present invention and a schematic sectional view for explaining its main part, respectively.
Figure 3B:
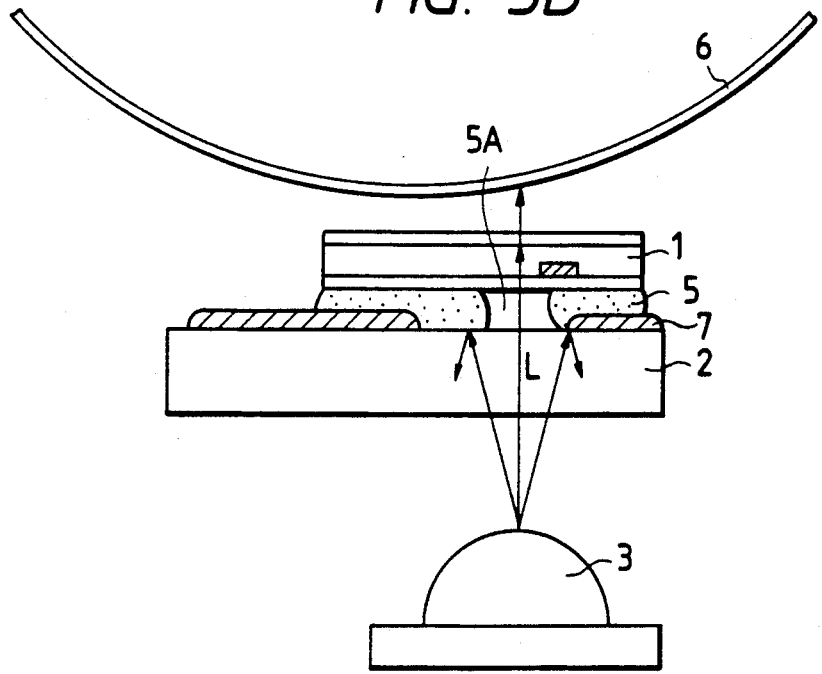

FIGS. 3A and 3B are a schematic exploded perspective view showing a photoelectric converter according to another embodiment of the present invention and a schematic sectional view for explaining its main part, respectively. Note that an adhesive 5 to be applied on, e.g., both side portions is not shown in FIG. 3A.

In this embodiment, a light-shielding layer 7 is formed between a transparent packaging substrate 2 and a transparent sensor substrate 1. The light-shielding layer 7 is arranged around a slit-like window portion properly determined in correspondence with an optical path L. The light-shielding layer 7 can be formed by the same process and using the same metal material as those of a wiring portion 4 or may be formed by using a nontransparent resin by a screen printing method, a dispensing method or the like.

In any case, according to the arrangement as shown in FIG. 3A, in addition to the basic effects of the first embodiment described above with reference to FIGS. 2A and 2B, the resolution of an output signal can be improved since the light-shielding layer 7 shields, of illumination light from a light source, stray light which causes noise in a signal output, e.g., irregular reflection components from the transparent packaging substrate 2.

Note that in the arrangement of the first embodiment shown in FIGS. 2A and 2B, a nontransparent material may be used as an adhesive 5 so that the adhesive 5 functions as a light-shielding layer. In this case, a step of forming the light-shielding layer 7 need not be performed. In other words, a nontransparent adhesive 5 can be used in the first embodiment shown in FIGS. 2A and 2B, and a range of selection for a material to be used as the adhesive 5 itself can function as a light-shielding layer. If this method is applied to the second embodiment, an arrangement as shown in FIG. 3B is obtained.

Figure 4:
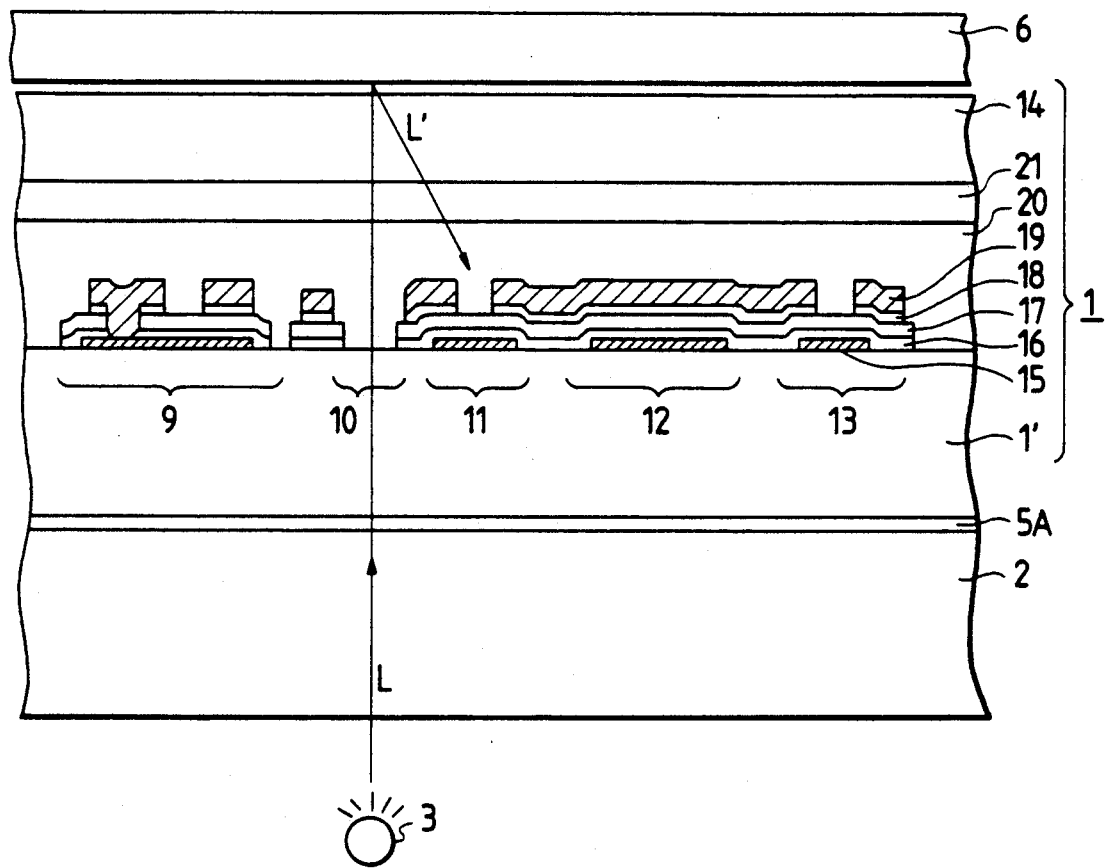
FIG. 4 is a schematic sectional view showing a sensor substrate used in the photoelectric converters according to the first and second embodiments of the present invention.

FIG. 4 shows a detailed sectional structure of the sensor substrate 1 of the photoelectric converter according to the first or second embodiment shown in FIGS. 2A and 2B or FIGS. 3A and 3B.

Referring to FIG. 4, a matrix wiring portion 9, an illumination window 10, a light-receiving element 11, a charge storage portion (capacitor portion) 12 and a switching thin film transistor (TFT) 13 for transferring a stored charge at an arbitrary timing, all of which constitute a photosensor, are integrally formed on a base 1' consisting of glass having transparency or the like. A transparent sensor substrate 1 having the above arrangement is supported on a transparent packaging substrate 2 via an adhesive layer 5 (having an air layer 5A in an optical path portion). All these portions can be formed in the same manufacturing process. Each portion is composed of a lower electrode 15, formed on the base by using Cr to serve as a light-shielding layer of the sensor portion, a hydrogenated silicon nitride (SiNx:H) insulating layer 16 formed thereon, a hydrogenated amorphous silicon (a-Si:H) semiconductor layer 17 formed thereon, an n+-type a-Si:H ohmic layer 18 formed thereon, and an upper electrode 19 consisting of, e.g., Al formed thereon.

The photosensor portion having the above arrangement is covered with a passivation layer 20, and a thin glass plate 14 having a thickness of, e.g., 50 μm is formed on the passivation layer 20 via an adhesive layer 21. A document is moved on the thin glass plate 14 in contact therewith. The thin glass plate 14 functions as a spacer layer for maintaining a distance between the light-receiving element 11 and a document 6 and as an anti-wear layer. A transparent conductive film may be formed between the thin glass plate 14 and the passivation layer 20 and held at a constant potential to prevent an influence of static electricity generated due to contact with a document.

In this arrangement, illumination light L radiated from the lower side of the transparent packaging substrate 2 is transmitted through the transparent packaging substrate 2 and the transparent sensor substrate 1 to illuminate the document 6 placed on the thin glass plate 14 through the illumination window 10. Information light L' reflected by the document is incident on the light-receiving element 11.

Figure 5:
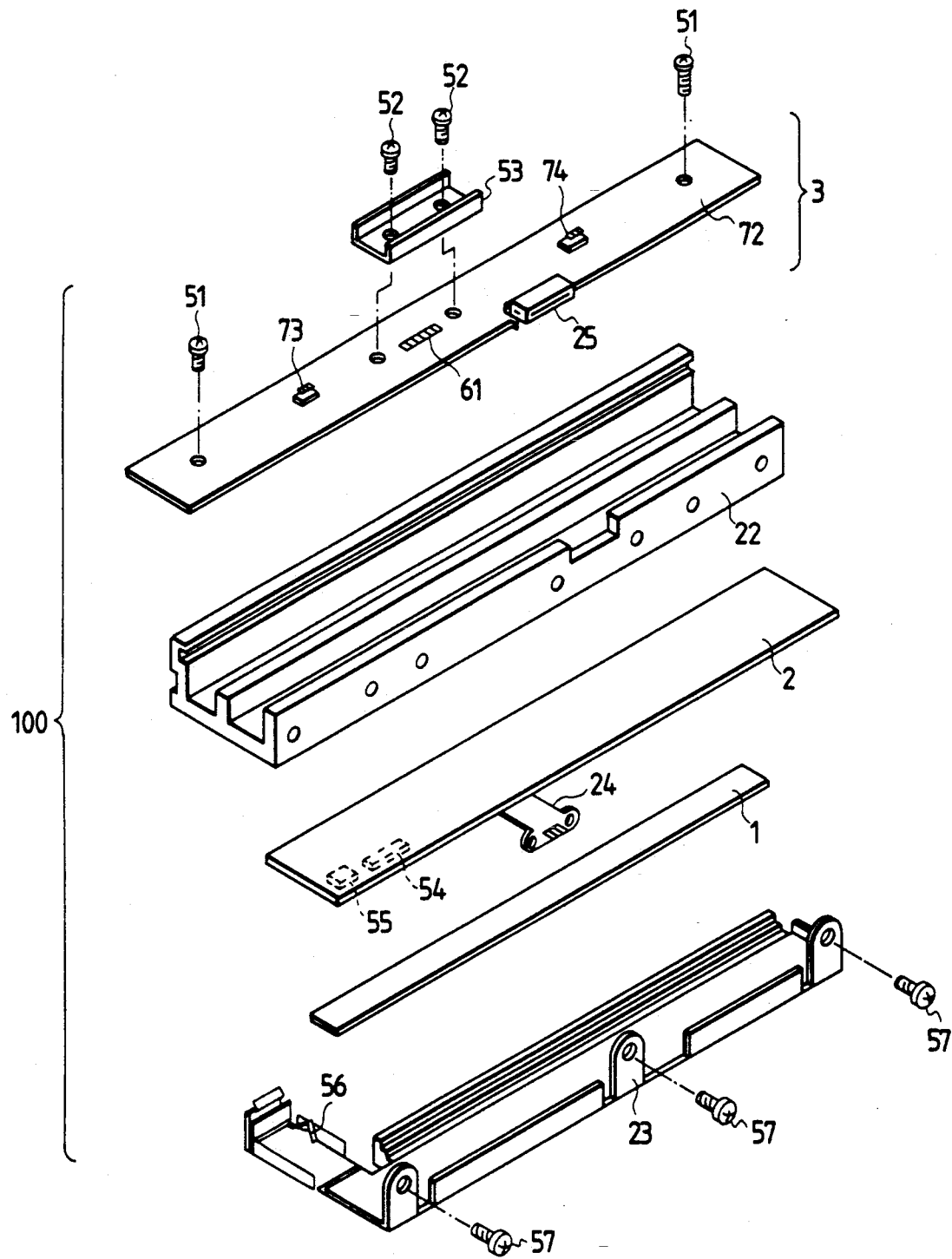
FIG. 5 is an exploded perspective view showing a photoelectric converter as a unit according to the present invention.

FIG. 5 is an exploded perspective view showing a detailed arrangement of a photoelectric converter as a unit having the basic arrangement according to the first or second embodiment described above. FIG. 6A is a plan view showing a sensor unit of the converter shown in FIG. 5, FIG. 6B is a side view thereof, FIG. 6C is a rear view thereof, FIG. 6D is a sectional view taken along a line D—D' in FIG. 6A, and FIG. 6E is a sectional view taken along a line E—E' in FIG. 6A. Briefly, a transparent sensor substrate 1 is adhered and fixed on a transparent packaging substrate 2, and the transparent packaging substrate 2 is fixed on a base plate 22 and pressed by an IC cover 23. A light source 3 is fixed on the lower surface side of the base plate 22. An image signal can be output from the unit via a flexible wiring 24 and a connector 25. This arrangement will be described in more detail below.

The light source 3 has the following arrangement.

That is, although not shown, a light-emitting diode array as a light-emitting element is arranged below (FIG. 5) a plate 72 consisting of a nontransparent insulating material. Screws 52 of two pairs of screws 51 and 52 electrically and mechanically connect the flexible wiring 24 against a connection terminal 61 formed on the plate 72 via an urging member 53. Variable resistors or thermistors are used as light quantity adjusting and/or temperature correcting elements 73 and 74.

A driving IC chip 55 for outputting a signal for switching a signal transfer TFT of the photosensor and an output amplifying IC chip 54 for sequentially reading a signal by matrix driving are formed at an end portion of the packaging substrate 2.

Electrical connection between the photosensor and the wiring portion of the packaging substrate is also performed at a portion near the end portion of the packaging substrate 2 by wire bonding.

Electrical connection between the flexible wiring 24 and the wiring portion of the packaging substrate 2 is performed by an anisotropically conductive adhesive or an anisotropically conductive film.

The IC cover 23 covers the end portions of the sensor substrate 1 and a portion of the packaging substrate 2 on which the sensor substrate 1 is not placed and consists of stainless steel. The IC cover 23 is fixed to the base plate 22 by screws 57.

A leaf spring 56 obtains electrical connection with respect to a static electricity-shielding transparent conductive film of the photosensor, for preventing an influence of static electricity generated due to contact with a document.

Electrical connection between the above sensor unit and a converter main body for mounting the unit will be described below.

When an image read instruction is generated from a circuit at the converter main body side, the output amplifying and driving IC chips 54 and 55 are operated by a route including the connector 25, the terminal 61, the flexible wiring 24, and the wiring portion on the packaging substrate 2, thereby performing a read operation. At this time, a signal for driving the light-emitting element is transmitted from the connector 25 to the light source. The read signal is output via the output amplifying IC chip from the wiring portion on the packaging substrate 2 to the converter main body side via the connector 25.

As described above, the connector 25 for obtaining connection with respect to the converter main body is provided not on the packaging substrate 2 but at the light source 3. Therefore, a dynamic influence on the packaging substrate 2 can be reduced, and the wiring on the packaging substrate 2 is prevented from being complicated. In addition, deformation or deviation of the packaging substrate 2 can be prevented to realize accurate positioning with respect to the sensor substrate 1, thereby preventing an erroneous operation.

Although the connector may be arranged on the base plate 22, the above arrangement is more preferable.

Various types of apparatuses such as a facsimile apparatus and an image reader can be arranged by using a sensor unit 100 having the above arrangement.

Figure 7:
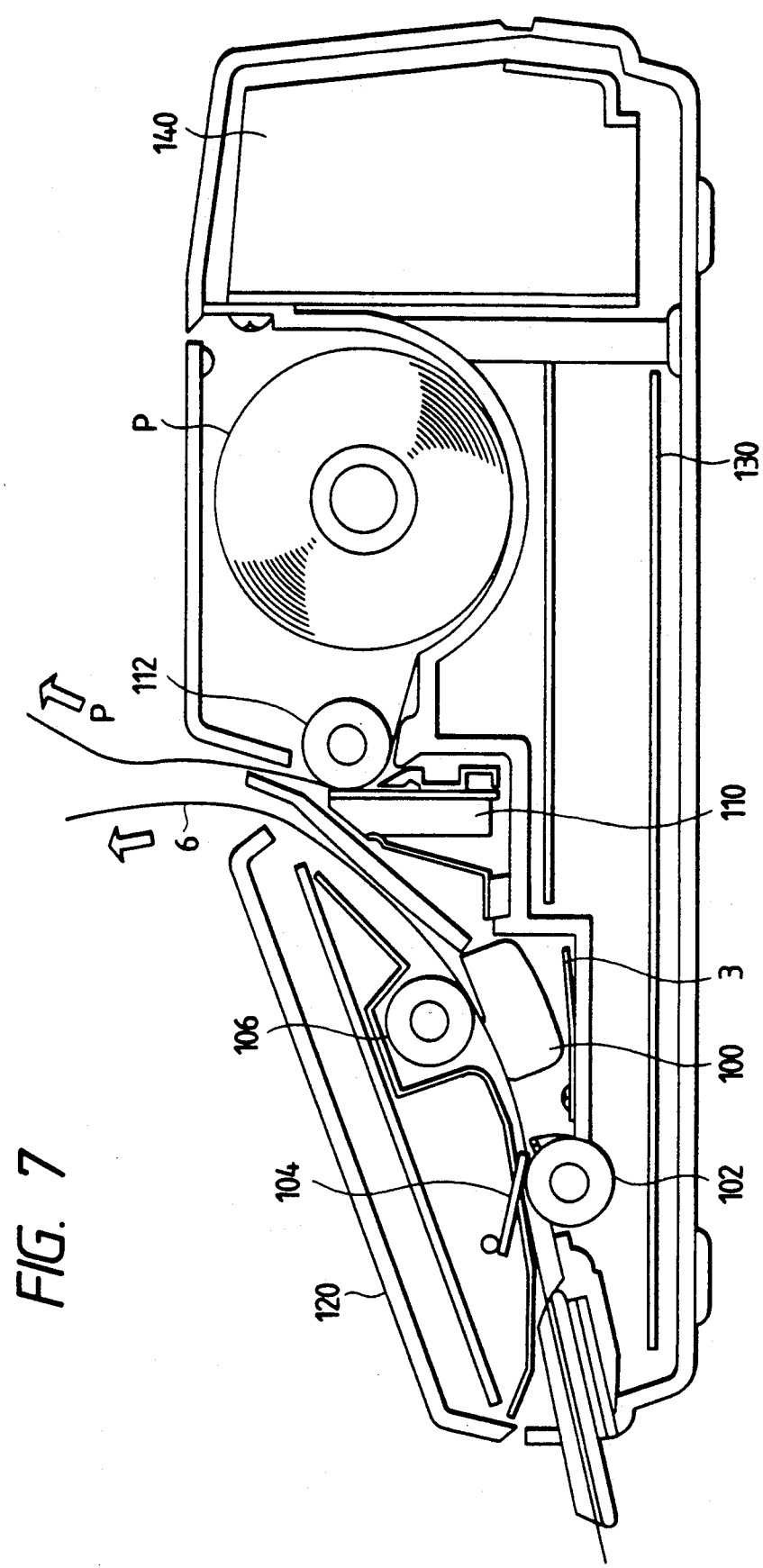
FIG. 7 is a schematic sectional view showing an image processing apparatus having a recording function according to the present invention.

FIG. 7 shows a facsimile apparatus having communicating means as an image processing apparatus with a recording function constituted by using the sensor unit 100 according to the present invention.

The facsimile apparatus includes a feed roller 102 for feeding a document 6 toward a read position, a separating member 104 for reliably separating and feeding the document 6 one after another and a platen roller 106 as conveyor means, located at the read position to oppose the sensor unit 100, for regulating a surface to be read of the document 6 and conveying the document 6.

A recording medium P is in the form of a roll of paper in FIG. 7. Image information read by the sensor unit 100 or externally transmitted image information in the case of a facsimile apparatus or the like is recorded on the recording medium P. Various types of heads such as a thermal head and an ink-jet recording head can be used as a recording head 110 for reproducing and/or recording the image. For example, a head injecting an ink by using heat energy is suitably used as the ink-jet head. This recording head may be of a serial type or a line type. A platen roller 112 conveys the recording medium P toward a recording position of the recording head 110 and regulates a surface to be recorded on the recording medium P.

An operation panel 120 includes switches for operation inputs, a display portion for displaying a message or a state of the apparatus and the like. A system control board 130 as control means includes a controller for controlling the respective sections, a driver for the photosensor, a processor for image information, a transmitter/receiver and the like. The apparatus also includes a power source 140.

In the above embodiment, no optical system is interposed between the photoelectric converter and the document 6 so that the document is read in contact with or close to the converter. The present invention, however, can be effectively applied to an arrangement in which information light (light reflected by a document surface) is imaged on a light-receiving element via an optical system.

Figure 8:
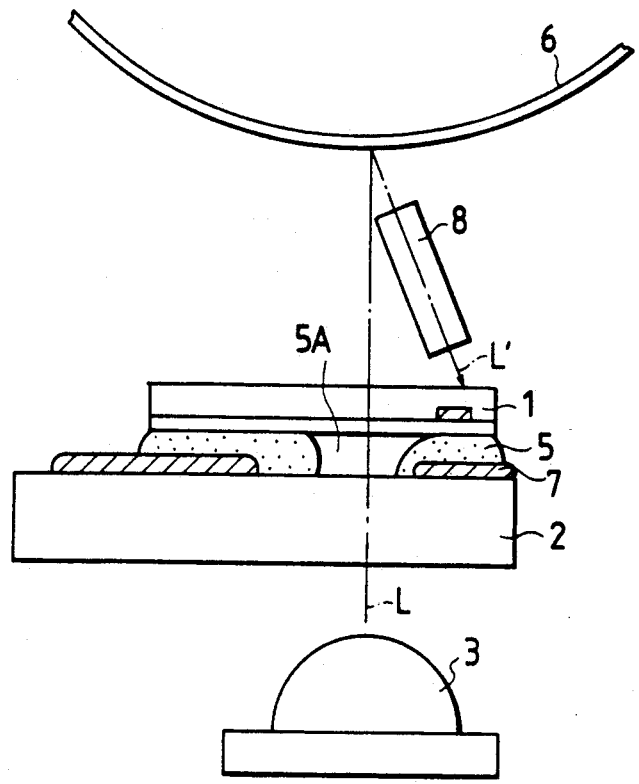
FIG. 8 is a schematic sectional view showing a photoelectric converter according to the present invention.

That is, the present invention can be easily applied to an arrangement in which an optical system member 8 such as a focusing light transmitter array or a fiber plate is used between a transparent sensor substrate 1 and a document 6, as shown in FIG. 8.

In the above embodiment, the wiring portion is formed on the transparent packaging substrate 2 as a preferable arrangement. The wiring portion, however, can be formed on another member. In this case, the wiring may be directly extracted from the transparent sensor substrate by using a flexible wiring.

As described above, according to the first and second embodiments of the present invention, illumination light is transmitted through the packaging substrate having transparency. Therefore, a degree of freedom of a location for the light source is improved, i.e., the light source can be arranged at the lower surface side of the transparent packaging substrate. As a result, an apparatus using the photoelectric converter can be made more compact.

In the above arrangements, information light is not transmitted through the transparent packaging substrate and the transparent sensor substrate. Therefore, since neither light quantity loss nor diffusion of the information light occur, the S/N ratio is improved to realize a high sensor output.

Since the air layer is formed in the optical path portion for illumination light between the transparent packaging substrate and the transparent sensor substrate, a step of removing bubbles in the adhesive layer need not be performed to simplify the manufacturing process, thereby reducing the manufacturing cost.

In addition, since a color adhesive, for example, can be used regardless of its transparency/nontransparency, a degree of freedom of selection for the adhesion is improved.

Furthermore, since the adhesive is partly coated and cured, stress can be relaxed by elasticity of the adhesive even if thermal expansion coefficients of the transparent packaging substrate and the transparent sensor substrate differ from each other.

3rd Embodiment

The third embodiment of the present invention will be described in detail below with reference to the accompanying drawings.

Figure 9:
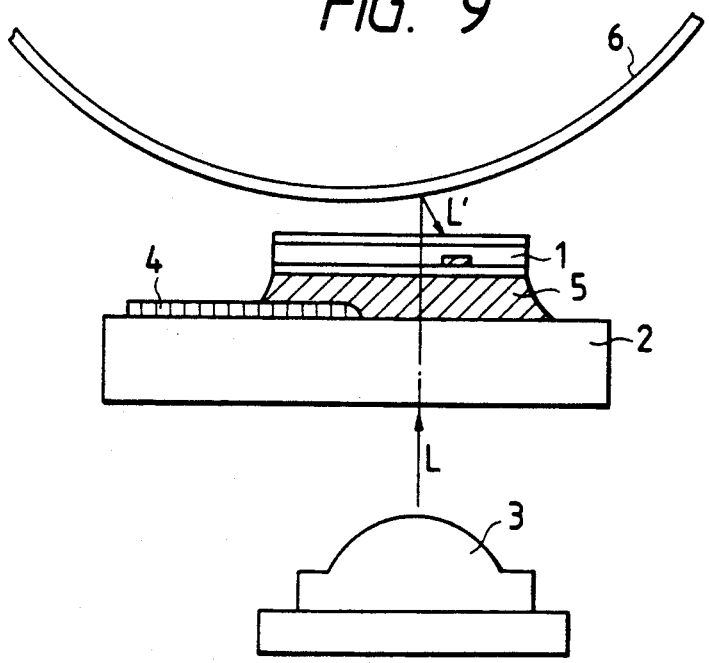
FIG. 9 is a schematic sectional view showing a portion around an end portion of a photoelectric converter according to the third embodiment of the present invention.

FIG. 9 is a sectional view showing a portion around an end portion of a photoelectric converter according to the third embodiment of the present invention. A light-shielding layer 7 (to be described later) is not shown in FIG. 9. Referring to FIG. 9, a transparent sensor substrate 1 has a photosensor array formed by a semiconductor process or the like on a substrate consisting of, e.g., quartz glass or a borosilicate glass having transparency and an insulating property. A transparent packaging substrate (mother board) 2 has a wiring portion 4 consisting of, e.g., Ag, Ag-Pd, Ag-Pt or Au formed by a thick film printing method or consisting of, e.g., Al, Cu, Mo or ITO formed by photolithography on a base material consisting of, e.g., quartz glass, borosilicate glass, soda glass or acryl (may have a protective film consisting of $SiO_2$ or the like to prevent elution or diffusion of an alkali element) having transparency and an insulating property. Materials having close thermal expansion coefficients are used for the bases of these substrates.

The wiring portion 4 connects a sensor portion to a driver portion (not shown). The transparent sensor substrate 1 is adhered on the transparent packaging substrate 2 by an adhesive layer 5. Preferable examples of the adhesive layer 5 are silicone-, acryl- and epoxy-based room temperature curing, heat curing, and photosetting transparent adhesives. The adhesive layer 5 consists of a material having a thermal expansion coefficient close to those of materials of the bases of the transparent sensor substrate 1 and the transparent packaging substrate 2 and is applied on both the end portions in the longitudinal direction of the photoelectric converter to adhere the substrates 1 and 2.

The transparent sensor substrate 1 and the wiring portion 4 of the transparent packaging substrate 2 are electrically connected by wire bonding, soldering or the like.

Illumination light L from a light source 3 such as an LED is radiated on a document 6 through the transparent packaging substrate 2 and the transparent sensor substrate 1, and information light reflected by the document 6 is incident on a light-receiving element on the transparent sensor substrate 1 and output as an image signal from the light-receiving element.

According to this embodiment, since the information light is received by the photosensor without being transmitted through the packaging substrate 2 and the sensor substrate 1, an S/N ratio is not reduced due to a light quantity loss or stray light components. According to this embodiment, the transparent sensor substrate 1 and the transparent packaging substrate 2 can be handled as independent parts, i.e., can be manufactured in independent steps. Therefore, the manufacturing steps need not be organized, and only good products can be used in independent examination steps, thereby improving the total yield. Since only the photosensor portion is located on the base of the substrate 1, a plurality of substrates 1 can be simultaneously manufactured from a base material having a certain area, thereby reducing the manufacturing cost. In addition to the wiring portion 4, a driving IC chip, an output amplifying IC chip and the like can be mounted on the transparent packaging substrate 2. In this case, the manufacturing cost can be further reduced. When the light source 3 is arranged at the lower surface side of the transparent packaging substrate 2, the unit size can be further reduced.

That is, according to this embodiment, since illumination light is transmitted through the packaging substrate having transparency, a degree of freedom of a location of the light source is improved, i.e., the light source can be arranged at the lower surface side of the transparent packaging substrate. As a result, an apparatus using this photoelectric converter can be made more compact.

Since information light is not transmitted through the transparent packaging substrate and the transparent sensor substrate, neither a light quantity loss nor diffusion of the information light occur. Therefore, the S/N ratio is improved to realize a high sensor output.

According to this embodiment, the base materials having close thermal expansion coefficients are used for the transparent packaging substrate and the transparent sensor substrate. Therefore, since stress produced upon bonding of the two substrates can be relaxed, the substrates do not easily warp or crack.

Furthermore, since the wiring portion is formed on the transparent packaging substrate 2, the converter can be made compact. If the wiring portion is formed between the transparent packaging substrate and the transparent sensor substrate, the converter can be made more compact.

Figure 10A:
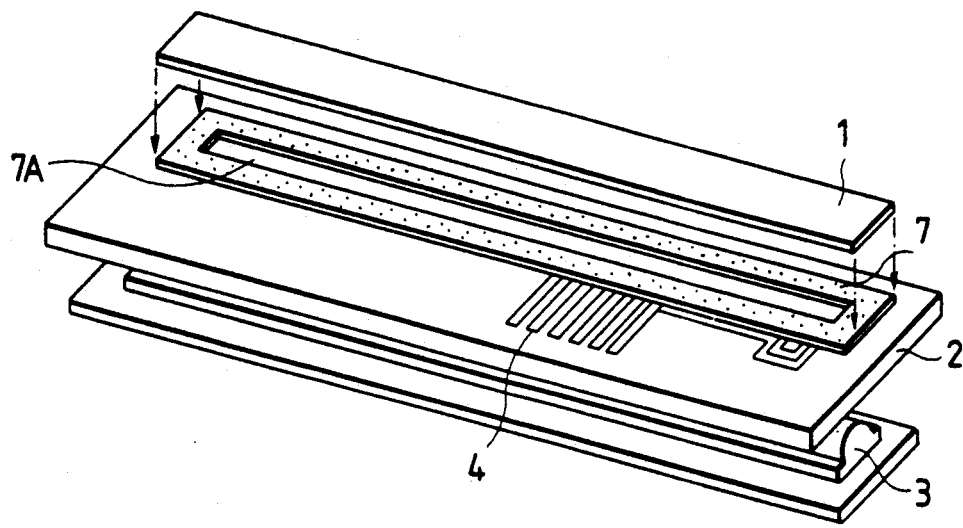
FIGS. 10A and 10B are a schematic exploded perspective view showing the photoelectric converter according to the third embodiment of the present invention and a sectional view showing its main part, respectively.
Figure 10B:
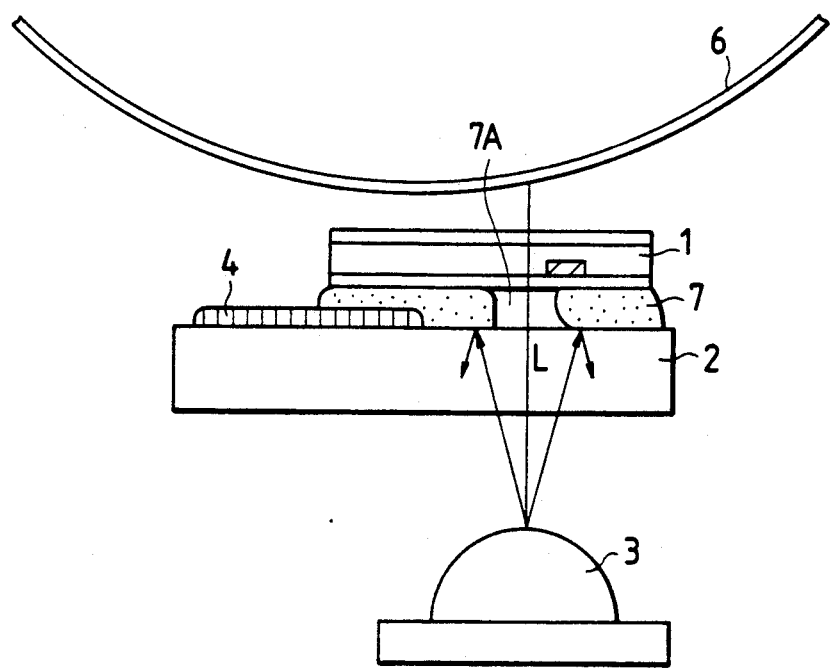

FIGS. 10A and 10B are an exploded perspective view showing a photoelectric converter according to this embodiment and a sectional view showing its main part. Note that an adhesive 5 formed at portions near both the ends of the converter is not shown in FIG. 10A.

Referring to FIGS. 10A and 10B, a light-shielding layer 7 is formed between a transparent packaging substrate 2 and a transparent sensor substrate 1. The light-shielding layer 7 is arranged around a slit-like window portion 7A properly determined in correspondence with an optical path L. The light-shielding layer 7 can be formed by the same process and using the same metal material as those of a wiring portion 4 or may be formed by a screen printing method, a dispensing method or the like by using a nontransparent conductive resin. Alternatively, a nontransparent conductive material may be used as the adhesive for adhering the transparent packaging substrate 2 and the transparent sensor substrate 1, thereby forming the light-shielding layer 7. In this case, a step of forming the adhesive 5 need not be performed.

The light-shielding layer 7 as described above is formed on a portion of the transparent packaging substrate 2 except for the optical path of the illumination light L and has the slit-like window portion 7A for transmitting light. This slit-like window portion may be left as a gap or filled with a transparent resin. Alternatively, an adhesive having transparency may be applied in the slit-like window portion to adhere the two substrates 1 and 2. In this case, a material having an optical refractive index close to those of the substrates 1 and 2 is preferably used as the adhesive.

In any case, according to the arrangement as shown in FIGS. 10A and 10B, in addition to the basic effects as described above with reference to FIG. 9, the resolution of an output signal can be improved since the light-shielding layer 7 shields, of the illumination light from the light source, stray light which causes noise in a signal output, e.g., irregular reflection components from the transparent packaging substrate 2.

As will be described later, the light-shielding layer 7 formed by using a conductive material can function as an electrical shielding layer with respect to noise.

A detailed sectional structure of the substrate 1 of the photoelectric converter according to the third embodiment is similar to that shown in FIG. 4.

Referring to FIG. 4, a matrix wiring portion 9, an illumination window 10, a light-receiving element 11, a charge storage portion (capacitor portion) 12, and a switching thin film transistor (TFT) 13 for transferring a stored charge at an arbitrary timing, all of which constitute a photosensor, are integrally formed on a substrate 1' consisting of glass or the like having transparency. The transparent sensor substrate 1 having the above arrangement is supported on a transparent packaging substrate 2 via an adhesive layer and/or a light-shielding layer (having a window at an optical path portion). These portions can be formed by the same manufacturing process. Each portion is composed of a light-shielding layer lower electrode 15 of the sensor portion formed on the base by using Cr, a hydrogenated silicon nitride (SiNx:H) insulating layer 16 formed thereon, a hydrogenated amorphous silicon (a-Si:H) semiconductor layer 17 formed thereon, an n+-type a-Si:H ohmic layer 18 formed thereon, and an upper electrode 19 consisting of Al or the like formed thereon.

The photosensor portion having the above arrangement is covered with a passivation layer 20, and a thin glass plate 14 having a thickness of, e.g., 50 μm is formed on the passivation layer 20 via an adhesive layer 21. A document is slidably moved on the thin glass plate 14 in contact therewith. The thin glass plate 14 functions as a spacer layer for maintaining a distance between the light-receiving element 11 and the document 6 constant and as an anti-wear layer.

In this arrangement, illumination light L radiated from the lower surface side of the transparent packaging substrate 2 is transmitted through the transparent packaging substrate 2 and the transparent sensor substrate 1 and illuminates the document 6 on the thin glass plate 14 through the illumination window 10. Information light L' reflected by the document 6 is incident on the light-receiving element 11.

An exploded perspective view showing a detailed arrangement of the photoelectric converter as a unit having the above basic arrangement is the same as that shown in FIGS. 5 and FIGS. 6A to 6E.

Referring to FIG. 5 and FIGS. 6A to 6E, a transparent sensor substrate 1 is adhered and fixed on a transparent packaging substrate 2, and the transparent packaging substrate 2 is fixed to a base plate 22 and pressed by an IC cover 23. A light source 3 is fixed on the lower surface side of the base plate 22. An image signal can be output from the unit via a flexible wiring 24 and a connector 25.

Figure 11A:
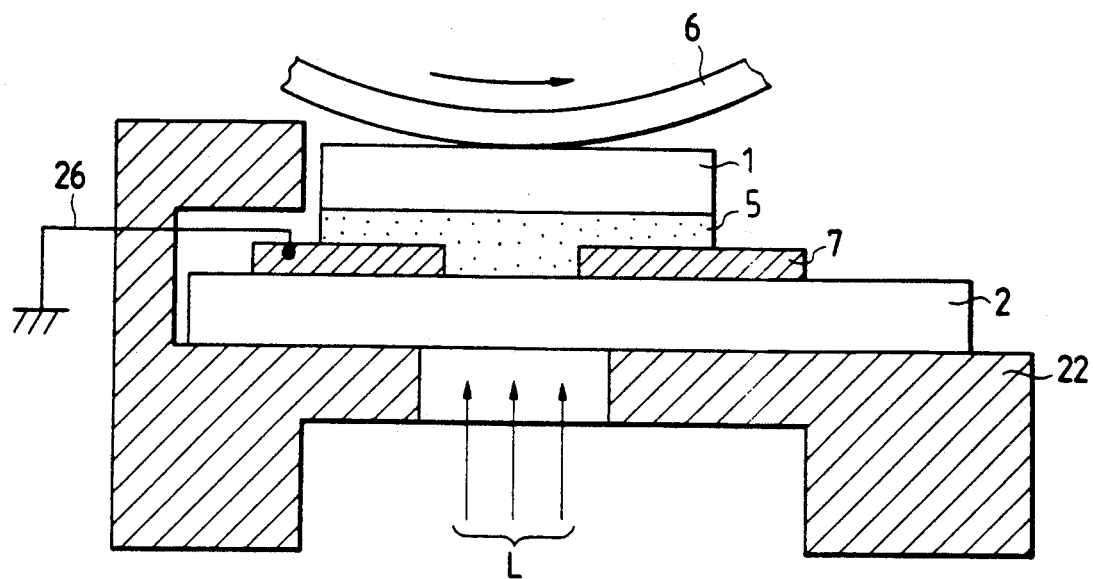
FIGS. 11A and 11B are a schematic sectional view and a schematic exploded perspective view, respectively, for explaining the function of the photoelectric converter according to the third embodiment of the present invention.
Figure 11B:
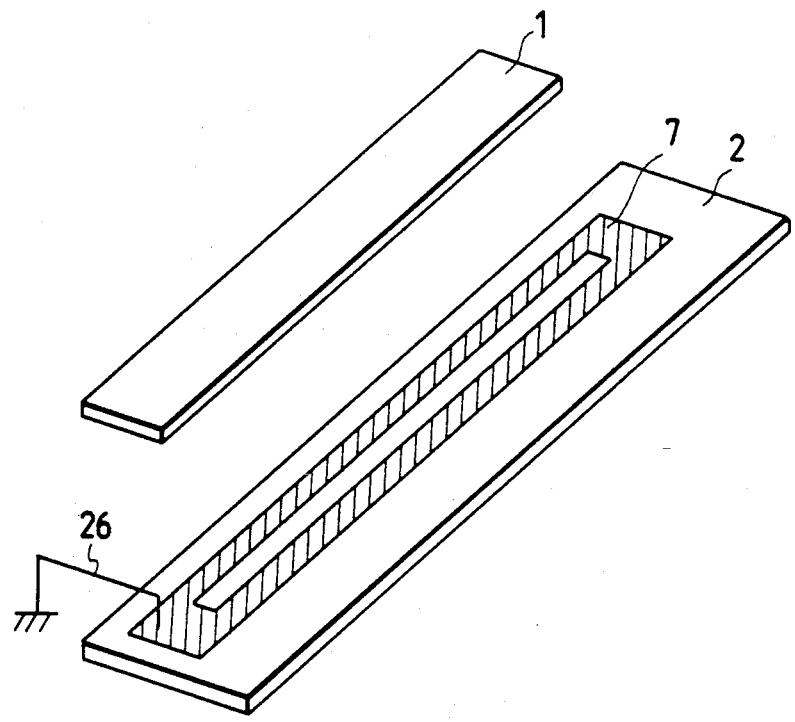

FIGS. 11A and 11B are views for explaining the function as an electrical shielding layer of the light-shielding layer 7 consisting of a conductive material, which is the feature of the third embodiment.

The light-shielding layer 7 can be formed as a thin film consisting of, e.g., Al, Cr, Ta or Ti on the transparent packaging substrate 2 or by using a conductive paste consisting of, e.g., Ag or carbon. A shielding effect can be obtained by maintaining the light-shielding layer 7 having conductivity at a constant potential. As the light source 3, an LED, a discharge tube such as an Ex tube, an EL, a fluorescent tube and the like can be used. Especially when a discharge tube is used, radiation noise components are generated from the light source since the tube is driven by an RF high voltage. The shielding effect according to this embodiment is effective also in this case. Note that a GND line 26 in FIGS. 11A and 11B drops the voltage of the light-shielding layer 7 to a GND potential.

According to the arrangement of this embodiment, a proper shielding effect can be obtained without considering an influence on a base plate upon paper passing. According to the arrangement of this embodiment, a material of the base plate need not be conductive but may be insulative. Therefore, a range of selection for the base plate material is widened to allow selection of an insulating resin or the like.

Various types of apparatuses such as a facsimile apparatus and an image reader can be constituted by using the sensor unit 100 having the above arrangement. An image processing apparatus (e.g., a facsimile) constituted by using the sensor unit 100 according to this embodiment is similar to that shown in FIG. 7. In this embodiment, however, the ground line 26 is commonly, electrically connected to and grounded with a ground line of the main body.

As such a potential holding method, the ground line 26 may be commonly, electrically connected to a ground line of a driving or signal processing IC, a shielding conductor of a photoelectric converting element and the like and connected to the ground line at the main body side.

Alternatively, as in a grounding method for a static electricity shielding transparent conductive film formed under the thin glass plate 14 of the sensor substrate 1, the ground line 26 may be grounded via the IC cover 23.

As described above, according to this embodiment, illumination light is transmitted through the packaging substrate having transparency. Therefore, a degree of freedom of a location for the light source is improved, i.e., the light source can be arranged at the lower surface side of the transparent packaging substrate. As a result, an apparatus using this photoelectric converter can be made more compact.

Since information light is no transmitted through the transparent packaging substrate and the transparent sensor substrate, neither a light quantity loss nor diffusion of the information light occur. Therefore, an S/N ratio is improved to realize a high sensor output.

According to this embodiment, the light-shielding layer shields, of illumination light from the light source, stray light which causes noise in an output signal, e.g., irregular reflection components from the transparent packaging substrate, thereby improving the resolution of the output signal.

In addition, the light-shielding layer on the transparent packaging substrate is formed by using a conductive material to function also as an electrical shielding layer. Therefore, a proper shielding effect can be obtained without considering an influence of static electricity generated upon paper passing on the base plate.

Furthermore, since the base plate need not be conductive but may be insulative, a range of selection for a material of the base plate can be widened.

4th Embodiment

The fourth embodiment of the present invention will be described in detail below with reference to the accompanying drawings.

A photoelectric converter according to the fourth embodiment of the present invention is the same as that shown in FIG. 9. Therefore, the same reference numerals as in FIG. 9 denote the same parts and a detailed description thereof will be omitted.

In this embodiment, a light-adjusting pattern is formed on a substrate 2 as will be described later with reference to FIGS. 12A, 12B, 13A and 13B.

An exploded perspective view and a sectional view showing the photoelectric converter according to this embodiment are the same as those of FIGS. 3A and 3B. In this embodiment, however, a light-shielding layer 7 is formed between the transparent packaging substrate 2 and a transparent sensor substrate 1.

The light-shielding layer 7 is arranged around a slit-like window portion 7A properly determined in accordance with an optical path L. The light-shielding layer 7 can be formed by the same process and using the same metal material as those of a wiring portion 4 or may be formed by a screen printing method or a dispensing method using a nontransparent resin. Alternatively, a nontransparent adhesive for adhering the transparent packaging substrate 2 and the transparent sensor substrate 1 may be formed as the light-shielding layer 7. In this case, a step of additionally applying an adhesive need not be performed.

The light-shielding layer 7 as described above is formed on a portion on the transparent packaging substrate 2 except for an optical path for illumination light L and has a slit-like window portion for transmitting light. This slit-like window portion may be left as a gap or filled with a transparent resin. A light-adjusting pattern for shading correction and the like is formed on a portion on the packaging substrate 2 corresponding to the window portion as will be described later with reference to FIGS. 12A to 13B.

In any case, in addition to the effects as described above, the light-shielding layer 7 shields, of illumination light from the light source, stray light which causes noise in a signal output, e.g., irregular reflection components by the transparent packaging substrate 2, thereby improving the resolution of the output signal.

A detailed sectional structure of the photoelectric converter according to this embodiment is similar to that shown in FIG. 4, and a detailed description thereof will be omitted.

In this arrangement, illumination light L radiated from the lower surface side of a transparent packaging substrate 2 is transmitted through the transparent packaging substrate 2 and a transparent sensor substrate 1 and radiates a document 6 on a thin glass plate 14 through an illumination window 10. Information light L' reflected by the document 6 is incident on a light-receiving element 11. The photoelectric converter is assembled as a unit as described above with reference to FIGS. 5 and 6A to 6E.

Figure 12A:
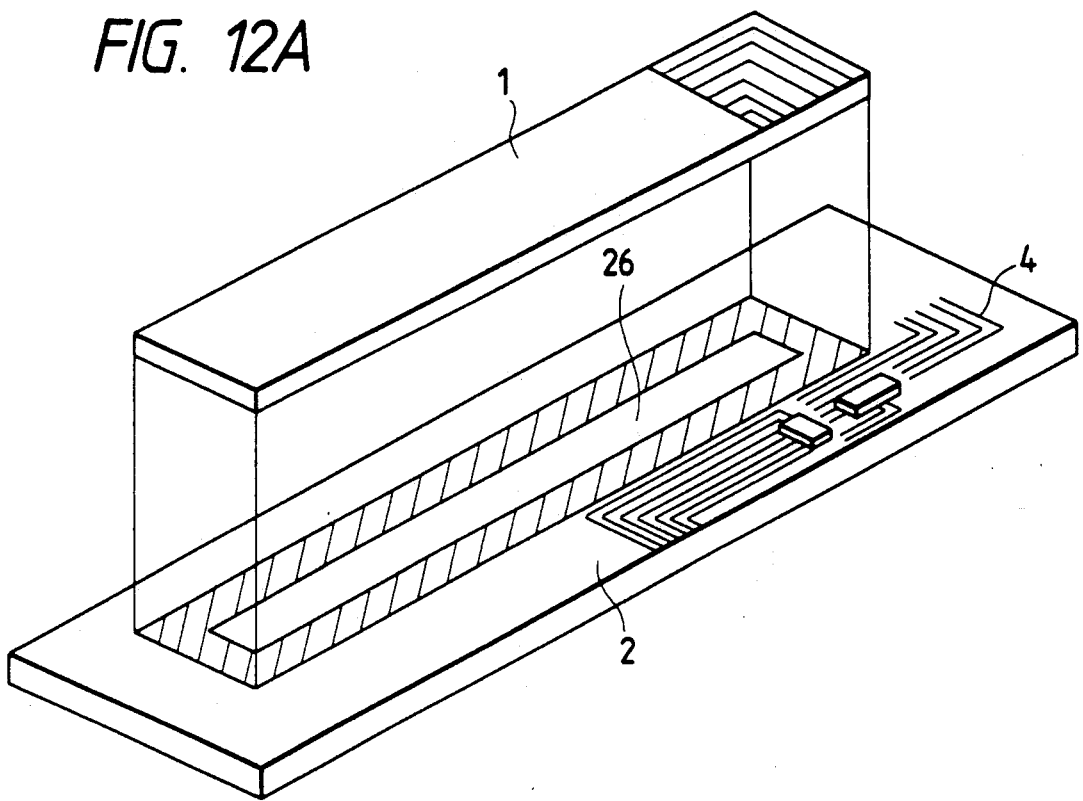
FIGS. 12A and 12B are a schematic exploded perspective view showing a photoelectric converter according to the fourth embodiment of the present invention and a schematic plan view showing its light-adjusting pattern, respectively.
Figure 12B:
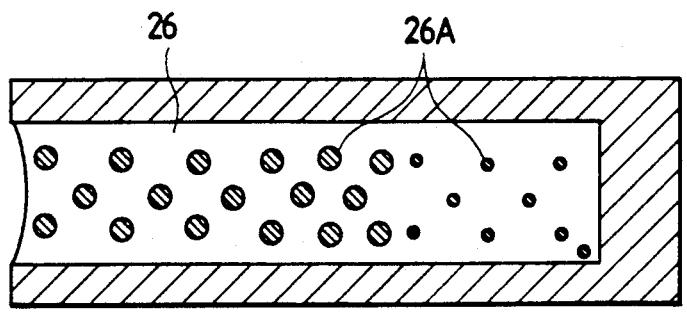

FIGS. 12A and 12B show a detailed arrangement of a light-adjusting pattern portion which can be applied to the arrangement of this embodiment. In this arrangement, a light-adjusting pattern 26A is formed on a light-adjusting pattern formation portion 26 in an optical path of illumination light on a transparent packaging substrate 2 at the same time a wiring portion 4 is formed by using the same material. The light-adjusting pattern portion 26 is formed by using a thin film consisting of, e.g., Al, Cr, Ta or Ti or a thick film printing electrode material of a conductive paste (e.g., Ag or carbon) and by properly determining a pattern density, a size, a pitch and the like in accordance with a light quantity variation in a light source 3 (e.g., an LED, an Ex tube, a fluorescent tube or EL), thereby uniforming an illumination distribution on the document surface. In this arrangement, circular patterns are arranged such that small circles are located at the end portions while large circles are located at the center.

Figure 13A:
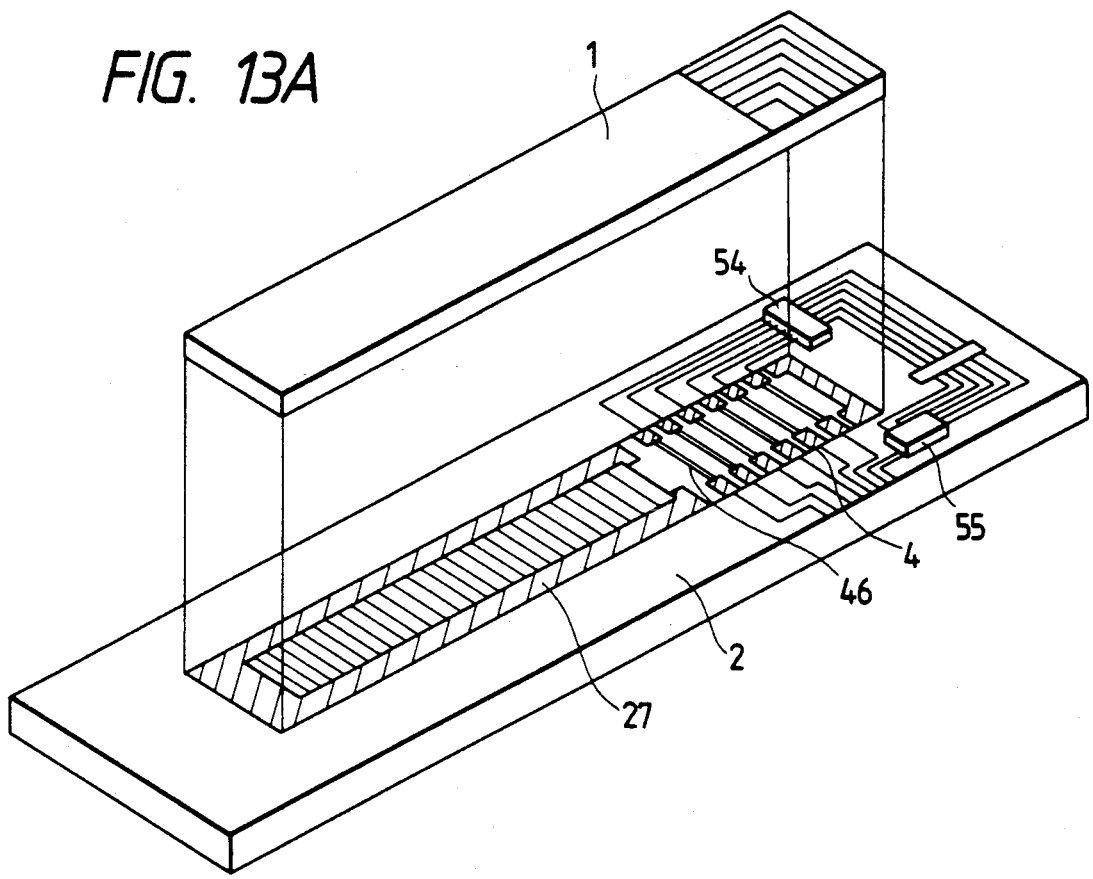
FIGS. 13A and 13B are a schematic exploded perspective view showing a modification of the photoelectric converter according to the fourth embodiment of the present invention and a schematic plan view showing its light-adjusting pattern, respectively.
Figure 13B:
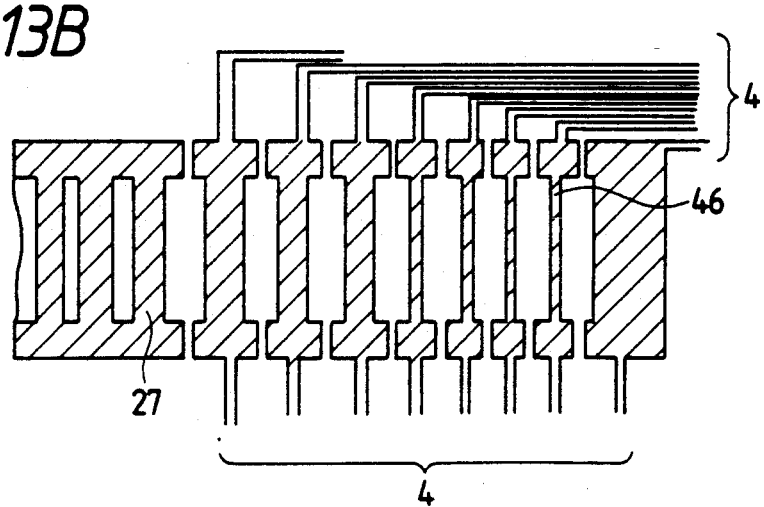

FIGS. 13A and 13B show another detailed arrangement of the light-adjusting pattern. In this arrangement, a wiring portion 4 on a transparent packaging substrate 2 extends across an optical path for illumination light, and a light-adjusting pattern 46 is formed on the optical path portion of the wiring portion 4 by determining its line width in accordance with a light quantity distribution of a light source. A light-adjusting pattern 27 as a dummy wiring pattern is formed on the optical path portion except for the light-adjusting pattern portion 46 on the wiring portion 4.

Figure 14:
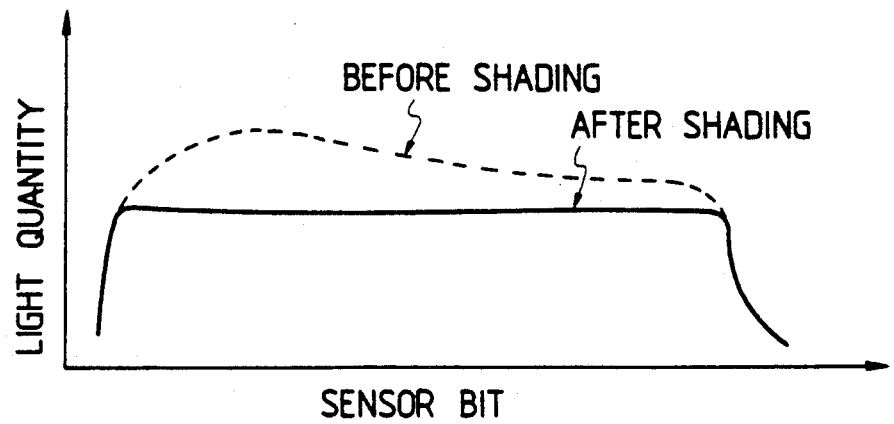
FIG. 14 is a graph for explaining a light quantity distribution according to the fourth embodiment of the present invention.

FIG. 14 shows a light quantity distribution obtained when the light-adjusting pattern as shown in FIGS. 12A and 12B or 13A and 13B is formed (after shading) and that obtained when the pattern is not formed (before shading).

As is apparent from FIG. 14, when the light-adjusting pattern is formed, a good uniform light quantity distribution is obtained throughout an arrangement range of the photoelectric converting element (sensor bit). Therefore, the document surface is illuminated by uniform illumination light to improve the quality of a read image.

Various types of apparatuses such as a facsimile apparatus and an image reader can be constituted by using the sensor unit 100 having the above arrangement.

A detailed arrangement of an image processing apparatus (e.g., a facsimile) constituted by using the sensor unit 100 according to this embodiment is the same as that shown in FIG. 7.

In the embodiment described above, no optical system is interposed between the photoelectric converter and the document 6 so that the document is read in contact with or close to the converter. The present invention, however, can be effectively applied to an arrangement in which information light (light reflected from the document surface) is imaged on a light-receiving element through via an optical system.

As described above, according to this embodiment, illumination light is transmitted through the packaging substrate having transparency. Therefore, a degree of freedom of a location of the light source is improved, i.e., the light source can be arranged at the lower surface side of the transparent packaging substrate. As a result, an apparatus using this photoelectric converter can be made more compact.

Since information light is not transmitted through the transparent packaging substrate and the transparent sensor substrate, neither light quantity loss nor diffusion of the information light occur. Therefore, an S/N ratio is improved to realize a high sensor output.

According to the present invention, the light-adjusting pattern portion is formed on the transparent substrate by the same step and using the same material as those of the wiring portion. Therefore, no lighting curtain as an additional member need be formed, or no assembling step for this purpose need be performed. As a result, the size and the manufacturing cost of the converter can be reduced.

Since the light-adjusting pattern portion on the transparent packaging substrate can be formed by using the wiring portion, the converter can be made more compact, and a degree of freedom of design in an arrangement of an IC chip or the like is improved.

In the above embodiment, no optical system is interposed between the photoelectric converter and the document 6 so that the document is read in contact with or close to the converter. The present invention, however, can be effectively applied to an arrangement in which information light (light reflected from the document surface) is imaged on a light-receiving element via an optical system.

Figure 15:
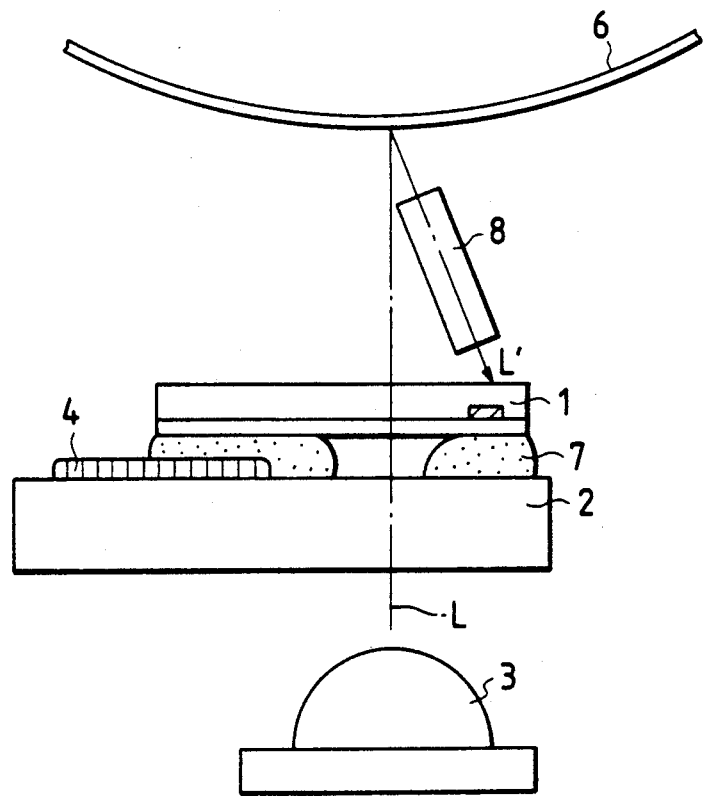
FIG. 15 is a schematic sectional view showing a photoelectric converter according to the present invention.

That is, the present invention can be easily applied to an arrangement in which an optical system member 8 such as a focusing light transmitter array or a fiber plate is used between a transparent sensor substrate 1 and a document 6, as shown in FIG. 8 described above or FIG. 15.

As has been described above, according to the present invention, illumination light is transmitted through the packaging substrate having transparency. Therefore, a degree of freedom of a location of the light source is improved, i.e., the light source can be arranged at the lower surface side of the transparent packaging substrate. As a result, an apparatus using this photoelectric converter can be made more compact.

Since information light is not transmitted through the transparent packaging substrate and the transparent sensor substrate, neither light quantity loss nor diffusion of the information light occur. Therefore, the S/N ratio is improved to realize a high sensor output.

What is claimed is:

1. A photoelectric converter comprising:
    a) a first substrate which is insulative and transparent and which has a first surface and a second surface;
    b) a second substrate which is larger than said first substrate and which is insulative and transparent, said second substrate being provided on said second surface of said first substrate;
    c) a photoelectric converting element provided on said first surface of said first substrate;
    d) a light source for emitting illumination light through said first and second substrates toward an original, the illumination light being reflected from a surface of the original such that the reflected light is incident on said photoelectric converting element;
    e) a first light-shielding member provided between a photoelectric converting portion of said photoelectric converting element and said first surface of second substrate; and
    f) a second light-shielding member provided between said second surface of said first substrate and said second substrate,
    wherein said first and second light-shielding members prevent the illumination light from directly impinging on said photoelectric converting portion of said photoelectric converting element.

2. A photoelectric converter according to claim 1, wherein said photoelectric converting element includes a charge stored section and a switching transistor.

3. A photoelectric converter according to claim 1, wherein said photoelectric converting portion includes an amorphous silicon layer provided on said first light-shielding member and spaced from said first light-shielding member by an insulating layer.

4. A photoelectric converter according to claim 1, wherein said second light-shielding member comprises a conductor maintained at a constant potential.

5. A photoelectric converter according to claim 1, further comprising a support member for holding said second substrate and said light source.

6. A photoelectric converter according to claim 1, wherein said second substrate is provided with a semiconductor integrated circuit which is electrically connected to said photoelectric converting element.

7. An image reading apparatus mounting a photoelectric converter according to claim 1, further comprising control means for controlling driving of said photoelectric converter.

8. An image reading apparatus with a recording function according to claim 7, further comprising a recording head.

9. An image reading apparatus with a recording function according to claim 8, wherein said recording head is an ink-jet recording head.

10. An apparatus with a recording function according to claim 9, wherein said recording head ejects an ink by using heat.

11. A photoelectric converter according to claim 5, wherein said second substrate is provided with a semiconductor integrated circuit which is electrically connected to said photoelectric converting element.

* * * * *

UNITED STATES PATENT AND TRADEMARK OFFICE
CERTIFICATE OF CORRECTION

PATENT NO. : 5,261,013
DATED : November 9, 1993
INVENTOR(S) : MASAYOSHI MURATA ET AL.

Page 1 of 2

It is certified that error appears in the above-identified patent and that said Letters Patent is hereby corrected as shown below:

COLUMN 1

Line 6, "07/481,226" should read --07/481,227--.
Line 8, "INVENTION:" should read --INVENTION--.
Line 13, "black board," should read --blackboard,--.

COLUMN 2

Line 60, "INVENTION:" should read --INVENTION--.

COLUMN 4

Line 60, "its part" should read --its main part--.

COLUMN 5

Line 6, "plan" should read --plan view, a schematic side view, a schematic bottom view, a--.
Line 58, "surface, radiated" should read --surface, ¶ in which light emitted from the light source is radiated--.

COLUMN 6

Line 8, "is" should read --is transmitted through this gap.--.
Line 14, "its part" should read --its mainpart--.

UNITED STATES PATENT AND TRADEMARK OFFICE
CERTIFICATE OF CORRECTION

PATENT NO. : 5,261,013
DATED : November 9, 1993
INVENTOR(S) : MASAYOSHI MURATA ET AL.

It is certified that error appears in the above-identified patent and that said Letters Patent is hereby corrected as shown below:

COLUMN 8

Line 31, "adhesive 5" should read --adhesive is widened in this sense. In this case, the adhesive 5--.

COLUMN 15

Line 11, "no" should read --not--.

COLUMN 17

Line 12, "via" should be deleted.

COLUMN 18

Line 22, "second substrate;" should read --said first substrate;--.
    Line 32, "stored" should read --storage--.

Signed and Sealed this

Twentieth Day of September, 1994

Attest:

BRUCE LEHMAN

*Attesting Officer*  *Commissioner of Patents and Trademarks*